United States Patent
Marques et al.

(10) Patent No.: US 11,796,577 B2
(45) Date of Patent: Oct. 24, 2023

(54) MAKING DETERMINATION OF INDUCTANCE-CHANGE IMMUNE TO CHANGES IN ENVIRONMENTAL CONDITIONS

(71) Applicant: Ningbo Aura Semiconductor Co., Limited, Ningbo (CN)

(72) Inventors: Augusto Manuel Marques, Norwich (GB); Nigesh Baladhandapani, Bangalore (IN)

(73) Assignee: Ningbo Aura Semiconductor Co., Limited, Zhejiang (CN)

( * ) Notice: Subject to any disclaimer, the term of this patent is extended or adjusted under 35 U.S.C. 154(b) by 23 days.

(21) Appl. No.: 17/444,289

(22) Filed: Aug. 3, 2021

(65) Prior Publication Data
US 2022/0074979 A1 Mar. 10, 2022

(30) Foreign Application Priority Data
Sep. 9, 2020 (IN) .............................. 202041038857

(51) Int. Cl.
*G01R 23/14* (2006.01)
*G01R 5/20* (2006.01)
(Continued)

(52) U.S. Cl.
CPC ............ *G01R 23/145* (2013.01); *G01R 1/44* (2013.01); *G01R 5/00* (2013.01); *G01R 5/20* (2013.01);
(Continued)

(58) Field of Classification Search
CPC ...... G01D 11/30; G01D 5/202; G01D 5/2013; G01D 5/2006; G01D 5/22; G01D 5/2225;
(Continued)

(56) References Cited

U.S. PATENT DOCUMENTS 3,391,576 A * 7/1968 Takami ................. G01K 13/08
374/E7.038
5,187,989 A 2/1993 Bulteau
(Continued)

FOREIGN PATENT DOCUMENTS

CN 102879041 A 1/2013
CN 108645463 A 10/2018
(Continued)

OTHER PUBLICATIONS

Metal detection: beat frequency oscillator, https://www.embeddedrelated.com/showarticle/911.php, Jan. 30, 2016, 07 pages.
(Continued)

*Primary Examiner* — Vinh P Nguyen
(74) *Attorney, Agent, or Firm* — IPHORIZONS PLLC; Narendra Reddy Thappeta (57) ABSTRACT

A device includes a first oscillator, a second oscillator and a frequency comparison block. The first oscillator includes a first LC tank circuit and is designed to generate first sustained oscillations at a first resonant frequency. The second oscillator includes a second LC tank circuit and is designed to generate second sustained oscillations at a second resonant frequency. The frequency comparison block is designed to perform a comparison of the frequencies of the second sustained oscillations and the first sustained oscillations to determine a change in inductance in one of a first inductor of the first LC tank circuit and a second inductor of the second LC tank circuit. One of the oscillators serves as a reference oscillator, and enables determination of the change in inductance to be immune to changes in environmental conditions.

20 Claims, 8 Drawing Sheets

(51) Int. Cl.
  *G01R 31/28* (2006.01)
  *G01R 5/00* (2006.01)
  *G01R 1/44* (2006.01)
  *G01R 15/18* (2006.01)
(52) U.S. Cl.
  CPC ....... *G01R 15/181* (2013.01); *G01R 31/2817* (2013.01)
(58) Field of Classification Search
  CPC ...... G01D 5/12; G01D 5/225; G01D 2205/77; G01D 5/20; G01D 5/2053; G01D 5/243; G01D 5/2208; H03K 17/955; H03K 17/9547; H03K 17/945; H03K 17/9502; H03K 17/9525; G01N 22/00; G01N 27/023; G01N 1/00; G01N 2035/1025; G01N 27/9046; G01P 1/103; G01P 13/045; G01P 3/42; G01P 15/11; G01P 3/44; G01P 3/505; G01V 3/102; G01V 3/10; G01V 3/101; G01C 19/24; G01B 7/00; G01R 1/44; G01R 15/181; G01R 23/02; G01R 23/14; G01R 23/145; G01R 27/26; G01R 31/2817; G01R 35/00; G01R 5/20
  See application file for complete search history.

(56) References Cited

U.S. PATENT DOCUMENTS

| | | | | |
|---|---|---|---|---|
| 6,889,563 | B2 | 5/2005 | Tomita et al. | |
| 7,800,457 | B2* | 9/2010 | Unkrich | H03L 7/099 331/158 |
| 8,258,777 | B2* | 9/2012 | Chen | G01B 7/023 324/207.16 |
| 8,564,374 | B2* | 10/2013 | Chiu | H03L 7/097 331/25 |
| 9,214,895 | B2* | 12/2015 | Shanan | H03B 5/1215 |
| 9,214,937 | B2* | 12/2015 | Thoss | H03K 17/9525 |
| 9,945,695 | B2* | 4/2018 | Fusare | G01D 5/20 |
| 10,156,463 | B2* | 12/2018 | Yonezawa | G01F 1/075 |
| 2013/0220028 | A1* | 8/2013 | Kondo | G01F 1/06 73/861.77 |
| 2019/0028106 | A1* | 1/2019 | Annema | H03L 7/099 |

FOREIGN PATENT DOCUMENTS

CN 110823300 A 2/2020
EP 0408084 B1 4/1993

OTHER PUBLICATIONS

Demonstration of LC sensor for gas or water metering based on STM32L073Z-EVAL and STM32L476RG-NUCLEO boards, https://www.st.com/resource/en/application_note/dm00151831-demonstration-of-lc-sensor-for-gas-or-water-metering-based-on-stm32l073zeval-and-stm32l476rgnucleo-boards-stmicroelectronics.pdf, Sep. 2017, 70 pages.
Low-Power Water Flow Measurement With Inductive Sensing Reference Design, https://www.ti.com/lit/ug/tidud25a/tidud25a.pdf?ts=1600682896344&ref_url=https%253A%252F%252Fwww.google.com%252F, Sep. 2017, 22 pages.
Behzad Razavi, Basic LC VCOs, http://www.seas.ucla.edu/brweb/teaching/215C_W2013/VCOs1.pdf, Feb. 16, 2013, 19 pages.

* cited by examiner

MAKING DETERMINATION OF INDUCTANCE-CHANGE IMMUNE TO CHANGES IN ENVIRONMENTAL CONDITIONS

PRIORITY CLAIM

The instant patent application is related to and claims priority from the co-pending provisional India patent application entitled, "Oscillator with PCB Coil Inductance to Detect Metal Proximity", Serial No.: 202041038857, Filed: 9 Sep. 2020, which is incorporated in its entirety herewith to the extent not inconsistent with the description herein.

BACKGROUND

Technical Field

Embodiments of the present disclosure relate generally to electronic measurements, and more specifically to making determination of inductance-change immune to changes in environmental conditions.

Related Art

Change in inductance of an inductor is often exploited to measure parameters related to several phenomena. As an example, fluid flow rate and direction (the term fluid includes liquids and gases) can be estimated based on the principle of inductance change of an inductor when the inductor (when powered and carrying an alternating, or at least varying, current) is brought in proximity with a metal that is set in motion (e.g., rotary) by the fluid. Corresponding circuitry containing the inductor can generate signal(s) representative of inductance-change, and thereby enable estimation of the fluid-flow rate and/or direction.

However, environmental conditions such as ambient temperature and ambient humidity can also cause changes in inductance. Such inductance changes that are not due to the phenomenon being measured (e.g., fluid-flow) can affect the measurement of the parameters (e.g., fluid flow rate and/or direction) and yield erroneous values for the parameters.

Aspects of the present disclosure are directed to techniques for making determination of inductance-change immune to changes in environmental conditions, and applications of such techniques.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

A device implemented according to an aspect of the present disclosure includes a first oscillator, a second oscillator and a frequency comparison block. The first oscillator includes a first inductor-capacitor (LC) tank circuit, the first oscillator to generate first sustained oscillations at a first resonant frequency determined by the first LC tank circuit. A first inductor of the first LC tank circuit has a first default inductance. The second oscillator includes a second LC tank circuit, the second oscillator to generate second sustained oscillations at a second resonant frequency determined by the second LC tank circuit. A second inductor of the second LC tank circuit has a second default inductance.

The frequency comparison block is connected to receive each of the first sustained oscillations and the second sustained oscillations. When a metal is in proximity to one of the first inductor and the second inductor, the corresponding one of the first default inductance and the second default inductance changes, thereby changing the frequency of the corresponding one of the first sustained oscillations and the second sustained oscillations from the first resonant frequency and the second resonant frequency respectively. The frequency comparison block is designed to perform a comparison of the frequencies of the second sustained oscillations and the first sustained oscillations to determine a change in a corresponding one of the first default inductance and the second default inductance.

In an embodiment, the frequency comparison block is designed to obtain a ratio of the frequencies of the second sustained oscillations and the first sustained oscillations, and is implemented to contain a frequency counter, a frequency divider and a logic block. In an example application, the device is used to determine a rate of flow of a fluid.

In another embodiment, the device additionally includes a third oscillator and another frequency counter. The third oscillator includes a third LC tank circuit, the third oscillator to generate third sustained oscillations at a third resonant frequency determined by the third LC tank circuit. A third inductor of the third LC tank circuit has a third default inductance. The frequency comparison block is designed to obtain a ratio of the frequencies of the second sustained oscillations and the first sustained oscillations, as well as the third sustained oscillations and the first sustained oscillations. In an example application, the device is used to determine a direction of flow of a fluid.

Several aspects of the present disclosure are described below with reference to examples for illustration. However, one skilled in the relevant art will recognize that the disclosure can be practiced without one or more of the specific details or with other methods, components, materials and so forth. In other instances, well-known structures, materials, or operations are not shown in detail to avoid obscuring the features of the disclosure. Furthermore, the features/aspects described can be practiced in various combinations, though only some of the combinations are described herein for conciseness.

2. Example Device

Figure 1A:
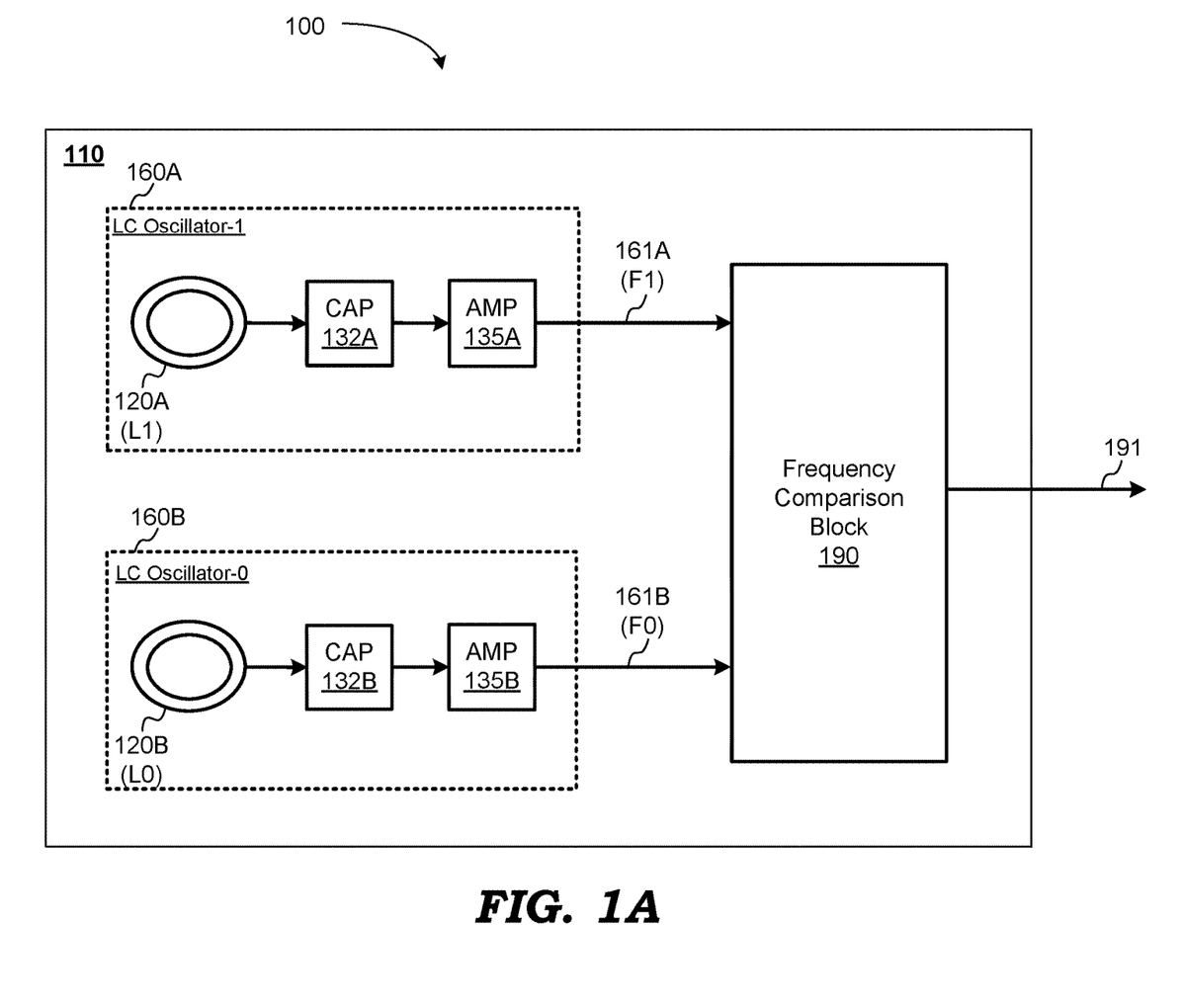
FIG. 1A is a block diagram of an example device implemented according to aspects of the present disclosure, in an embodiment.

FIG. 1A is a diagram illustrating the details of an example device in an embodiment of the present disclosure. Device 100 is shown containing LC oscillator-0 160B, LC oscillator-1 160A, frequency comparison block 190 and printed circuit board (PCB) 110. LC oscillator-0 160B, LC oscillator-1 160A, and frequency comparison block 190 are mounted on PCB 110, and in an embodiment are implemented using discrete blocks/components. However, in an alternative embodiment, only inductors 120A and 120B are implemented in discrete form, with frequency comparison block 190 implemented in integrated circuit (IC) form. In such an embodiment, inductors 120A and 120B are outside the IC, and inductor 120A, inductor 120B and the IC are mounted on PCB 110.

LC oscillator-0 160B is shown containing capacitor 132B, inductor 120B and amplifier 135B. Capacitor 132B and inductor 120B form an LC (inductor-capacitor) tank circuit, and the values of L and C determine the resonant frequency of oscillations. The output of the LC tank is shown coupled to amplifier 135B, which employs positive feedback (not shown) and generates sustained oscillations (i.e., oscillations that do not decay with respect to time when the oscillator is powered ON) on path 161B having resonant frequency F0. The magnitude of F0 is inversely proportional to the square root of inductance L0 of inductor 120B.

LC oscillator-1 160A is shown containing capacitor 132A, inductor 120A and amplifier 135A. Capacitor 132A and inductor 120A (L1) form another LC tank circuit, and the values of L and C determine the resonant frequency of oscillations. The output of the LC tank is shown connected to amplifier 135A, which employs positive feedback (not shown) and generates sustained oscillations on path 161A having resonant frequency F1. The magnitude of F1 is inversely proportional to the square root of inductance of L1.

The inductors L1 and L0 may be implemented in the form of coils having one or more turns, and located on each hemisphere (or each half, depending on the shape of the PCB) of PCB 110 to maximize the sensitivity of the measurements made by device 100. However, other forms and locations for the inductors can also be employed. Oscillations on each of paths 161A and 161B may be sinusoidal in nature.

In an embodiment described in detail below, inductors 120A and 120B are implemented to have the same inductance value and tolerance levels. Similarly capacitors 132A and 132B are implemented to have the same capacitance value and tolerance levels. As a result the (resonant) frequency of oscillations of the signals (i.e., the output of the oscillators) on paths 161A and 161B is the same. It is noted however, that the inductance and capacitance values of the two LC tanks can in general be different, thereby resulting in different frequencies of oscillations on paths 161A and 161B. In such case, frequency comparison block 190 and logic block 170 (both described below) may be implemented with corresponding changes to the techniques (than if the frequency of oscillation of signals 161A (F1) and 161B (F0) are equal) to make measurements such as, for example, determination of parameters related to fluid-flow, etc. For example, a calibration of device 100 may need to be performed before deploying to field. Also, with different resonant frequencies, a fixed offset in frequency difference or CD (count difference, both noted in sections below) will result, but will not impact the capabilities of device 100 described herein.

Figure 2:
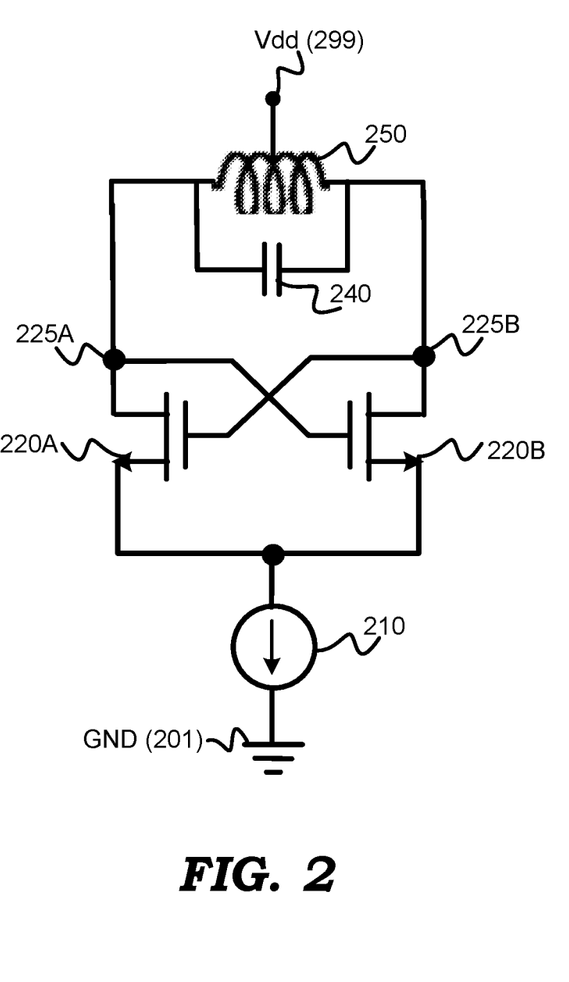
FIG. 2 is a diagram of an example topology that may be used to implement oscillators described in the present disclosure.
Figure 4A:
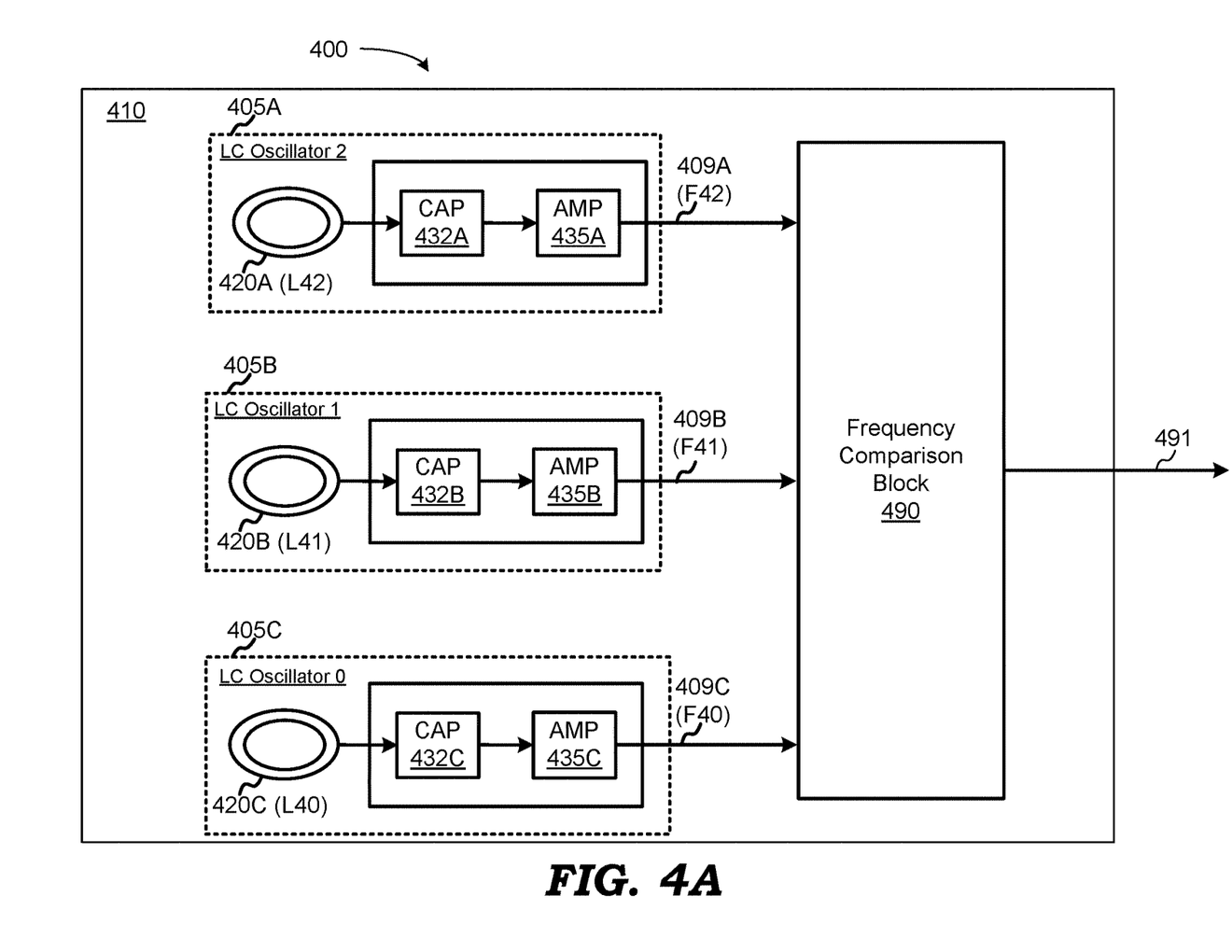
FIG. 4A is a diagram of a device implemented according to aspects of the present disclosure that is capable of determination of fluid-flow rate as well as determination of the direction of fluid-flow, in an embodiment of the present disclosure.

An example topology that may be used to implement either of oscillators 160A and 160B (as well as the oscillators of FIG. 4) is shown in FIG. 2. The oscillator topology of FIG. 2 is shown containing two cross-coupled transistors (220A and 220B), with an LC tank circuit (inductor 250 and capacitor 240 connected in parallel) as the load. Power supply Vdd (299) is connected to the center-tap of inductor 250. Current source 210 is connected between the source terminals of each of transistors 220A and 220B, and ground (GND 201). The values of inductances of inductor 250 and capacitance of capacitor 240 determine the resonant frequency of oscillations. The combination of inductor 250 and capacitor 240 corresponds to the LC tank circuit in oscillators of FIG. 1 and FIG. 4. The cross-coupling (from drain of one transistor to gate of the other) provides positive feedback, and ensures sustained (non-decaying) oscillations at the resonant frequency, which is available across nodes 225A and 225B as a differential signal, or between either of the nodes 225A and 225B and ground as a single-ended signal, and corresponds to the outputs (e.g., F1 (161A), F0 (161B), etc.) of the oscillators of FIG. 1 and FIG. 4. The operation of the circuit of FIG. 2 is well-known in the relevant arts, and is not described here in the interest of conciseness. It is also noted that other existing techniques and topologies can also be used instead to implement the oscillators. For example, circuits employing negative-resistance devices such as a tunnel diode can be combined with LC tank circuit to implement the oscillators noted herein.

Each of oscillators 160A and 160B has a 'default oscillation frequency.' As used herein 'default oscillation frequency' refers to the oscillation frequency of an oscillator when the inductance of the inductor in the tank circuit of the oscillator remains unchanged and unaffected by external factors such as proximity of the oscillator (or more precisely, the inductor in its LC tank circuit) to a metal, environmental factors such as temperature, humidity, etc. Similarly, each of inductors 120A (L1) and 120B (L2) has a 'default value' of inductance, the default value being the value with which the inductor was designed for and implemented. However, the inductance may be affected (and therefore be caused to change from the default value) by external factors such as proximity of the inductor to a metal, environmental factors such as temperature, humidity, etc.

As noted above, change in inductance of an inductor can be exploited to measure parameters related to several phenomena. As is well known, presence of a metallic object (metal) in the vicinity of an inductor (having current flowing through it) changes its inductance (from its default value). The magnitude of change in inductance generally depends on how close the metal is to the inductor. Thus, for example, presence of a metal close to inductor L1 would change the inductance of L1 from its default value. However, any such change would be (at least partially) indistinguishable from any change in inductance caused by environmental factors. For example, change in ambient temperature can cause a corresponding change in inductance. According to an aspect of the present disclosure, a reference oscillator (160B in FIG. 1) having a reference inductor (L0) is used in addition to the main oscillator 160A. Environmental factors would affect L1 and L0, and therefore frequencies F1 and F0, substantially equally, thereby resulting in equal changes in F1 and F0. Hence, by comparing F1 with F0, changes in L1 or L0 (if any) due to factors other than environmental factors can be determined, and used in several applications.

Presence of a metal in the vicinity of inductor 120A would change the value of L1, and therefore, F1. Similarly, presence of a metal in the vicinity of inductor 120B would change the value of L0, and therefore, L0. Inductors 120A and 120B are positioned sufficiently apart that a metal in the vicinity of inductor 120A does not significantly affect L0, and a metal in the vicinity of inductor 120B does not significantly affect L1.

Continuing with the description of FIG. 1A, frequency comparison block 190 receives signals 161A and 161B, and compares the two signals to determine if any change (from the default value) has occurred in the respective frequencies F1 and F0. Based on the result of the comparison, frequency comparison block 190 indicates on path 191 that the inductance of the corresponding inductor (120A or 120B) has changed.

The comparison of F1 and F0 can be achieved in various ways, as will be apparent to a skilled practitioner based on the disclosure provided herein. For example, frequency comparison block 190 can be implemented to obtain a difference of F1 and F0 obtained over a count window. If F1 is greater than F0, frequency comparison block 190 concludes that L1 has decreased in the count window. If F1 is less than F0, frequency comparison block 190 concludes that L0 has decreased in the count window. Frequency comparison block 190 also infers presence of metal in the vicinity of the corresponding oscillator/inductor based on the results of comparison. Further, based on the magnitude of the difference, frequency comparison block 190 can determine other conditions, such as, for example, the distance between the metal and the corresponding oscillator/inductor, based on the principle that the change in inductance of an inductor is inversely proportional to the distance between the inductor and the metal.

Alternatively, frequency comparison block 190 can be implemented to perform the comparison by obtaining a ratio of F1 and F0 (rather than a difference), and arrive at corresponding conclusions. Frequency comparison block 190 may internally convert the sinusoidal oscillations on path 161A and 161B to digital square-wave signals (for e.g., using comparators) prior to the comparison, and the resulting digital signals are also referred to for convenience as signals 161A and 161B herein.

Figure 1B:
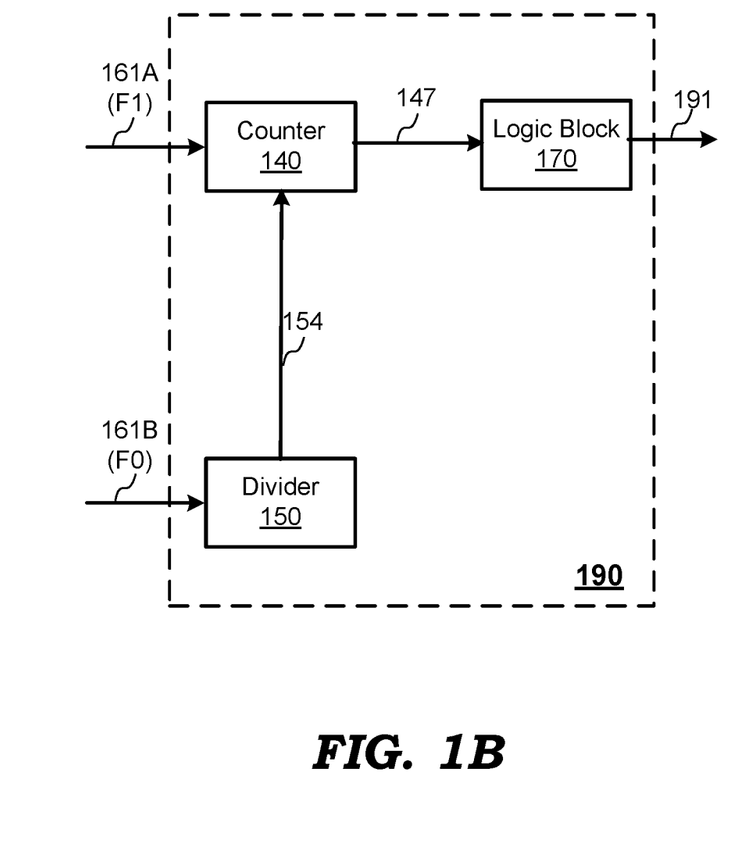
FIG. 1B is a block diagram of a frequency comparison block, in an embodiment of the present disclosure.

In an embodiment of the present disclosure, frequency comparison block 190 is designed to compare F1 and F0 by obtaining a ratio of F1 and F0, and is implemented as illustrated in FIG. 1B. In FIG. 1B, frequency comparison block 190 is shown as containing counter 140, divider 150 and logic block 170.

Counter 140 counts the number of cycles of signal 161A. Counter 140 may be implemented, for example, using a chain of flip-flops connected in sequence, and receives a signal 154 from divider 150. Signal 154 may, for example, be connected to an "enable" terminal of counter 140 that enables the counting operation of counter 140. Signal 154 indicates start and end instants defining a 'count window' of counter 140. Counter 140 may be implemented in a known way. Thus, counter 140 can be used to obtain the number of oscillations (cycles) of oscillator 160A (as represented by signal 161A or a signal derived from it) by counting the number of rising or falling edges of signal 161A occurring in a fixed duration (count window). The count window is set by divider 150 via path 154, as noted below.

The digital count obtained by counter 140 in the count window is dependent on the frequencies of signals 161A (F1) and 161B (F0), which in turn are respectively inversely proportional to inductances L1 and L0 of inductors 120A and 120B respectively (in general, $F \propto 1/\sqrt{L}$). As is well known in the relevant arts, an inductance value of an inductor changes when there is electromagnetic coupling between the inductor and a metal (when the inductor is powered ON and carrying an alternating current). The degree of change in inductance generally depends on how close the metal is to the inductor.

Divider 150 is a digital block that divides the frequency of signal 161B by a fixed value (although the value itself is programmable or can be changed easily) to generate a frequency-divided signal on path 154. As an example, the logic-high duration (or the logic-low duration, or one cycle/period)) of the frequency-divided signal can be used to enable counter 140 to count, thus defining the count-window. Alternatively, rather than forwarding the frequency-divided signal itself on path 154, signals derived from the frequency-divided signal can instead be forwarded on path 154 to set the count window. Signal 154 may be synchronous with signal 161B to get an accurate count window that can be represented as an integer multiple of the time period of signal 161B. Signal 161A is gated with signal 154 (within counter 140, details not shown). When signal 154 is asserted (e.g., logic HIGH), counter 140 gets a periodic input and counter operation starts. When signal 154 is de-US Non-Provisional Page 7 of 18 AURA-018-US asserted (e.g., logic-LOW), counter 140 is frozen (stops incrementing/counting), and the count value is sent to logic block 170. Thus, the count value on path 147 represents a ratio of the frequencies F1 and F0.

Logic block 170 receives the count value occurring in the count window on path 147, and processes the count value. One type of processing performed by logic block 170 is to determine if a change in count from the default count value (count value when each of the inductances of inductors L0 and L1 is unchanged) has taken place. Such change from the default count value enables logic block 170 to determine which one (but not both) of inductances of inductors 120A and 120B has changed. Such change is indicative only of factor(s) other than environmental effects on the inductors, provided that environmental factors affect both the inductors equally to the same extent.

Assuming that N cycles of F0 (161B) comprise the 'count window' of counter 140, then the count generated by counter 140 on path 147 equals (N×F1)/F0, wherein F1 and F0 are respectively the default oscillation frequencies of F1 (161A) and F0 (161B), 'x' represents the multiplication operator, and 'N' represents the cycles of F0 in count window 154.

Logic block 170 obtains a count difference (CD) given by the expression [N−(N×F1)/F0]. CD is indicative of a change in inductance of one of inductances of inductors 120A and 120B. Thus, when the default values L1 and L0, and therefore default value of frequencies F1 and F0, are equal, and there is no change in inductances L1 and L0, CD equals zero. A negative value of CD indicates that F1 has increased (F0 remaining unchanged at its default value) in the count window, and therefore that inductance of L1 has decreased in the count window. A positive value of CD indicates that F0 has increased (F1 remaining unchanged at its default value) in the count window, and therefore that inductance of L0 has decreased in the count window. A value of zero of CD indicates that no changes, or equal changes, have occurred in the inductances of L0 and L1. When metal is in proximity to either of the two inductors, the corresponding inductance decreases and hence frequency of the corresponding oscillator increases. So, based on the sign of CD, logic block 170 determines which inductor is in proximity to the metal, and provides such information on path 191. Further, logic block 170 also determines, based on the magnitude of CD, the (approximate) distance of the metal from the corresponding inductor.

Environmental changes such as, for example, changes in heat and/or humidity, would typically affect inductances of 120A and 120B equally, i.e., in the same way and to the same extent. From the above description, it may be appreciated that as long as changes in environment (e.g., heat and humidity) affect inductances of both inductors 120A and 120B in the same way and to the same extent (and therefore affecting F1 and F0 in the same way/same extent), count difference (CD) will remain zero. Therefore, the use of a reference oscillator having a reference inductor in device 100 (in addition to just one oscillator, as in some prior technique) enables device 100 to be used to determine parameters related to one or more phenomena (e.g., fluid-flow) that can be made to cause changes in inductance values, while being substantially immune to environmental effects on inductances.

Device 100 can be employed to detect, for example, displacement, rectilinear motion and rotational motion of a metallic object, and based on such detection determine parameters of several phenomena. One example use of device 100 is in the measurement of fluid-flow that causes a piece of metal to rotate in a circular motion, as described next.

3. Determining Fluid-Flow Rate

Figure 3A:
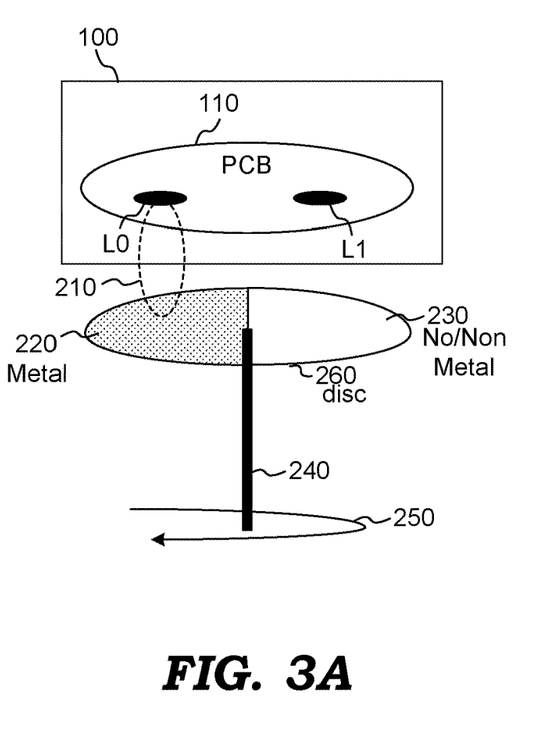
FIG. 3A is a diagram illustrating the manner in which a device can be used to determine flow-rate of a fluid (liquid or gas).
Figure 3B:
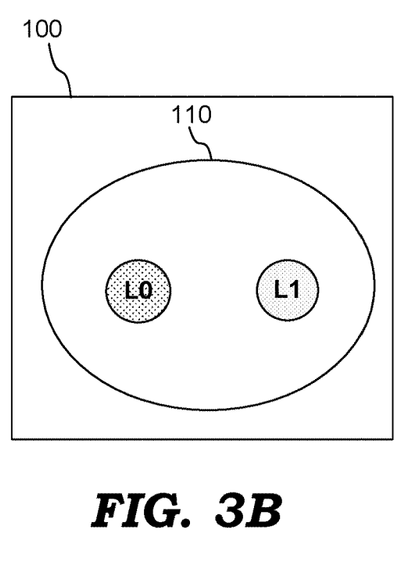
FIGS. 3B and 3C are diagrams used to illustrate the manner of computation of fluid-flow rate, in an embodiment of the present disclosure.
Figure 3C:
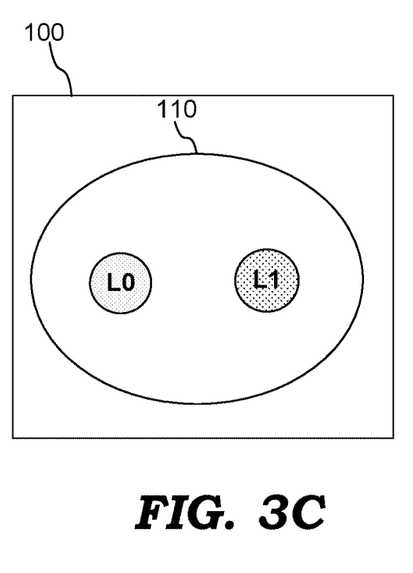

FIG. 3A is a diagram illustrating the manner in which device 100 of FIG. 1B can be used to determine flow-rate of a fluid (liquid or gas). In FIGS. 3A, 3B and 3C, only PCB 110 and the inductors 120A and 120B are shown for simplifying the description. However, it is to be understood that device 100 would contain all the other components/blocks of FIG. 1 as well, with inductors 120A and 120B being disposed as indicated.

PCB 110 is shown placed in proximity to disc/plate 260, for example, in such a way that the center of disc 260 aligns with shaft 240, and the planes of disc 260 and PCB 110 are substantially parallel to each other. One half of the disc is metal (220), while the other half is non-metal (230). Alternatively, disc 260 may contain only the metal portion 220, the other half of the disc containing no material at all. In other alternative embodiments, rather than one-half of the disc, metal (220) may cover a larger or smaller proportion of the disc, with corresponding changes to the techniques applied in logic block 170 to determine fluid-flow rate, as would be apparent to one skilled in the relevant arts upon reading the disclosure herein.

Referring again to FIG. 3A, it may be observed that the locations of inductor L0 and L1 are such that they are on different hemispheres (or halves) of PCB 110 and may thus ensure that metal 200 electromagnetically couples (at least predominantly) to only one inductor during every half rotation of disc 260. In the description below, a circular shape for disc 260 is assumed, although other shapes can also be used. Disc 260 is fixed to shaft 240. The combination of PCB 110 and disc 260 (plus shaft 240) can be assembled to be contained within a structure (e.g., a cylinder), not shown. Using suitable mechanisms (not shown), disc 260 can be made to rotate (as indicated by 250) about shaft 240 by the fluid (e.g., water flowing in a pipe, with the disc coupled to the inside of the pipe by the suitable mechanisms) whose rate of flow is desired to be measured. The number of rotations of the disc per unit time would be indicative of the rate of flow of the fluid. Marker 210 indicates the electromagnetic linkage between inductor L0 and metal 220, the linkage causing currents to flow in metal 220, which in turn reduces the inductance of inductor L0. In the embodiment described below, the default values (values unchanged by interactions with a metal, environment, etc.) of inductors 120A (L1) and 120B (L0) are equal, capacitances of capacitors 132A and 132B are equal, and therefore, default frequency F1 equals default frequency F0.

With device 100 powered ON and operational, as disc 260 rotates (as indicated by 250) due to fluid flow, in every rotation of the disc, metal portion 220 alternately moves to be proximal to inductor 120A (L1) and 120B (L0). In FIGS. 3B and 3C, that an inductor is proximal to metal 220 is indicated by a dot-filled circle, while that an inductor is proximal to non-metal 230 is indicated by a circle with no filling. Thus, FIG. 3B illustrates the condition when metal portion 220 is proximal (e.g., directly below) to inductor L0 (as indicated by the dot-filled circle for L0), while FIG. 3C illustrates the condition when metal portion 220 is proximal to (e.g., directly below) inductor L1 (as indicated by the dot-filled circle for L1).

When metal portion 220 is proximal to inductor L0 as illustrated in FIG. 3B, the magnitude of L0 is reduced (as noted above), while the magnitude of L1 remains unchanged (i.e., equal to default value). As noted above, the count generated by counter 140 equals (N×F1)/F0. With L0 reduced from its default value due to metal 220, F0 increases (F1 remaining the same due to no change in L1), and the count generated by counter 140 becomes less than the default value of [(N×F1)/F0]. The default value of [(N×F1)/F0] is its value when the values of inductances L0 and L1 are not affected by any metal and equal their respective default values.

When metal portion 220 is proximal to inductor L1 (as disc 230 rotates) and as illustrated in FIG. 3B, the magnitude of L1 is reduced, while the magnitude of L0 remains unchanged (i.e., equal to default value). With L1 reduced from its default value due to metal 220, F1 increases (F0 remaining the same due to no change in L0), and the count generated by counter 140 becomes greater than the default value of [(N×F1)/F0].

Denoting the default value of [(N×F1)/F0] as 'Default Count (NC)", the count (C) generated by counter 140 as disc 230 rotates as "Measured Count (MC)", then the count difference (CD) equals ["Measured Count"–Default Count"], and will alternate between a positive value and a negative value during each rotation of disc 230. Logic block 170 maintains a local copy of NC, which may be programmed into logic block 170. Logic block 170 also continuously computes CD.

During one half of the rotation of disc 230, metal 220 is proximal to inductor L1, there may be one or more instances of MC generated by counter 140. The specific number of instance(s) of MC depends on the speed of rotation of disc 230. However, it may be appreciated from the description above that each instance of MC will be greater than NC.

Thus, during such half of the rotation of disc 230, each of logic block 170's computations of CD will be positive.

During the other half of the rotation of disc 230, metal 220 is proximal to inductor L0, there may be one or more instances of MC generated by counter 140. The specific number of instance(s) of MC depends on the speed of rotation of disc 230, as also noted above. However, it may be appreciated from the description above that each instance of MC will be less than NC. Thus, during such half of the rotation of disc 230, each of logic block 170's computations of CD will be negative.

Logic block 170 computes the time between transitions between positive and negative values of CD. Twice the time computed equals the time for one rotation of disc 230. Logic block 170 may internally maintain a real-time clock, using which logic block 170 computes the time for one rotation. From the time thus obtained for one rotation, the number of rotations per second (rps), or rotations per minute (rpm) is calculated. From rps or rpm, and (if necessary) based on the manner in which disc 230 is coupled to the fluid (e.g., specific details of the coupling mechanism such as gears, gear ratios, etc., (parameters related to which may be stored in logic block 170 beforehand by the system deployer)), logic block 170 determines the rate of fluid flow (e.g., in meters per second), and provides the value on path 171.

The computed fluid-flow rate may be immune to environmental changes on the inductance values of inductors 120A and 120B, due to the reasons described above.

It is noted here that the techniques described above with respect to rotational motion of metal can be adapted to detect rectilinear motion of a metallic object also. For example, device 100 as shown in FIG. 3A can be placed proximal (and parallel) to a surface that moves in a straight line such as a conveyor belt. A metallic object placed on the moving surface would cause a corresponding one of inductance L0 and L1 (illustrated in FIGS. 3B and 3C) to change as the surface moves in a straight line, thereby causing F0 and F1 (and therefore CD) to change correspondingly as the metal passes beneath the corresponding inductor. Logic block 170 can be implemented to compute the time between a transition between a positive and a negative value (or vice versa) of CD to determine the speed of the surface.

With two inductors (120A and 120B) it is possible to detect only the rate of fluid flow, but not the direction. Therefore, device 100 can only be used for metering of unidirectional fluid flow.

According to another aspect of the present disclosure a device capable of measuring both the rate as well as direction of fluid flow is implemented using an additional third inductor, as described next.

4. Determining Direction of Flow and Rate of Flow

FIG. 4A is a diagram of a device 400 implemented according to aspects of the present disclosure, and which is capable of determination of fluid-flow rate as well as determination of the direction of flow. Device 400 is shown containing oscillators (LC oscillator 2—405A), (LC oscillator 1—405B), (LC oscillator 0—405-C, and PCB 410, frequency comparison block 490, and PCB 410. Oscillators (LC oscillator 2—405A), (LC oscillator 1—405B), (LC oscillator 0—405-C, and frequency comparison block 490 are mounted on PCB 410, and in an embodiment are implemented using discrete blocks/components. However, in an alternative embodiment, only inductors 420A (L42), 420B (L41) and 420C (L40) are implemented in discrete form, with the remaining components and/or blocks of FIG. 4 implemented in integrated circuit (IC) form. In such an embodiment, inductors L42, 142 and L40 are outside the IC, and all of L42, L41 and L40 and the IC are mounted on PCB 410.

In general, each of oscillators 405A, 405B and 405C is similar to the oscillators of FIG. 1A.

LC oscillator-0 405C is shown containing capacitor 432C, inductor 420C and amplifier 435C. Capacitor 432C and inductor 420C form an LC (inductor-capacitor) tank circuit, and the values of L and C determine the resonant frequency of oscillations. The output of the LC tank is shown connected to amplifier 435C, which employs positive feedback (not shown) and generates sustained oscillations (i.e., oscillations that do not decay with respect to time as long as the oscillator is powered ON) on path 409C having resonant frequency F40.

LC oscillator-1 405B is shown containing capacitor 432B, inductor 420B and amplifier 435B. Capacitor 432B and inductor 420B form an LC (inductor-capacitor) tank circuit, and the values of L and C determine the resonant frequency of oscillations. The output of the LC tank is shown connected to amplifier 435B, which employs positive feedback (not shown) and generates sustained oscillations (i.e., oscillations that do not decay with respect to time as long as the oscillator is powered ON) on path 409B having resonant frequency F41.

LC oscillator-2 405A is shown containing capacitor 432A, inductor 420A and amplifier 435A. Capacitor 432A and inductor 420A form an LC (inductor-capacitor) tank circuit, and the values of L and C determine the resonant frequency of oscillations. The output of the LC tank is shown connected to amplifier 435A, which employs positive feedback (not shown) and generates sustained oscillations (i.e., oscillations that do not decay with respect to time as long as the oscillator is powered ON) on path 409A having resonant frequency F42.

Similar to as in the example of FIG. 1A, each of frequencies F40, F41 and F42 has a default value. Each of inductors 420A, 420B and 420C has a respective default inductance L42, L41 and L40. In the description below, L42, L41 and L40 each have the same default value and manufacturing tolerance levels. Similarly, capacitors 432A, 432B and 432C are implemented to have the same capacitance value and tolerance levels. As a result, the default values of F42, F41 and F40 are the same. However, L42, L41 and L40, and therefore F42, F41 and F40, can in general have different default values, with frequency comparison block 490 and logic block 470 (both described below) implemented with corresponding changes to the techniques described below. For example, with different resonant frequencies, a fixed offset in frequency difference or CD1 and/or and CD2 (count difference, both noted in sections below) will result. Frequency comparison block 490 and logic block 470 can be implemented to account for such offset in their respective operations described below, and their operations will not impact the capabilities of device 400 described herein. Similar to as in FIG. 1A, a metal in the vicinity of an inductor changes the frequency of the corresponding oscillator.

Frequency comparison block 490 receives signals 409A, 409B and 409C. Frequency comparison block 490 compares frequencies of signals 409A and 409C, as well as 409B and 409C to determine if any change (from the default value) has occurred in the respective frequencies F42, F41 and F40. Based on the result of the comparison, frequency comparison block 490 indicates on path 491 that the inductance of the corresponding inductor has changed. The operation of frequency comparison block 490 is similar to that of frequency comparison block 190, and therefore only briefly described below in the interest of conciseness. Thus, frequency comparison block 490 can perform the comparison noted above by obtaining the differences of the corresponding pair of frequencies (F42 and F40, and F42 and F41), or by obtaining a ratio of the corresponding pair of frequencies.

Figure 4B:
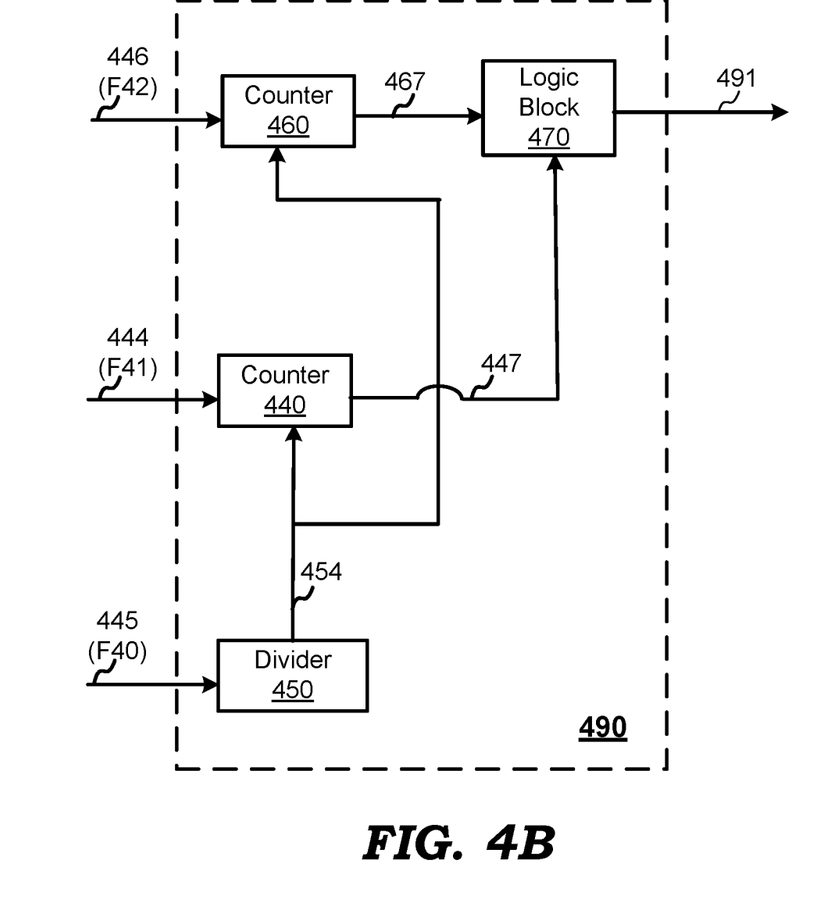
FIG. 4B is a block diagram of a frequency comparison block, in another embodiment of the present disclosure.

In an embodiment of the present disclosure, frequency comparison block 490 is designed to compare frequency pairs (F42 and F40, and F42 and F41) by obtaining a ratio of F42 and F40, and F42 and F41, and is implemented as illustrated in FIG. 4B. In FIG. 4B, frequency comparison block 490 is shown as containing counters 440 and 460, divider 450 and logic block 470.

Figure 6:
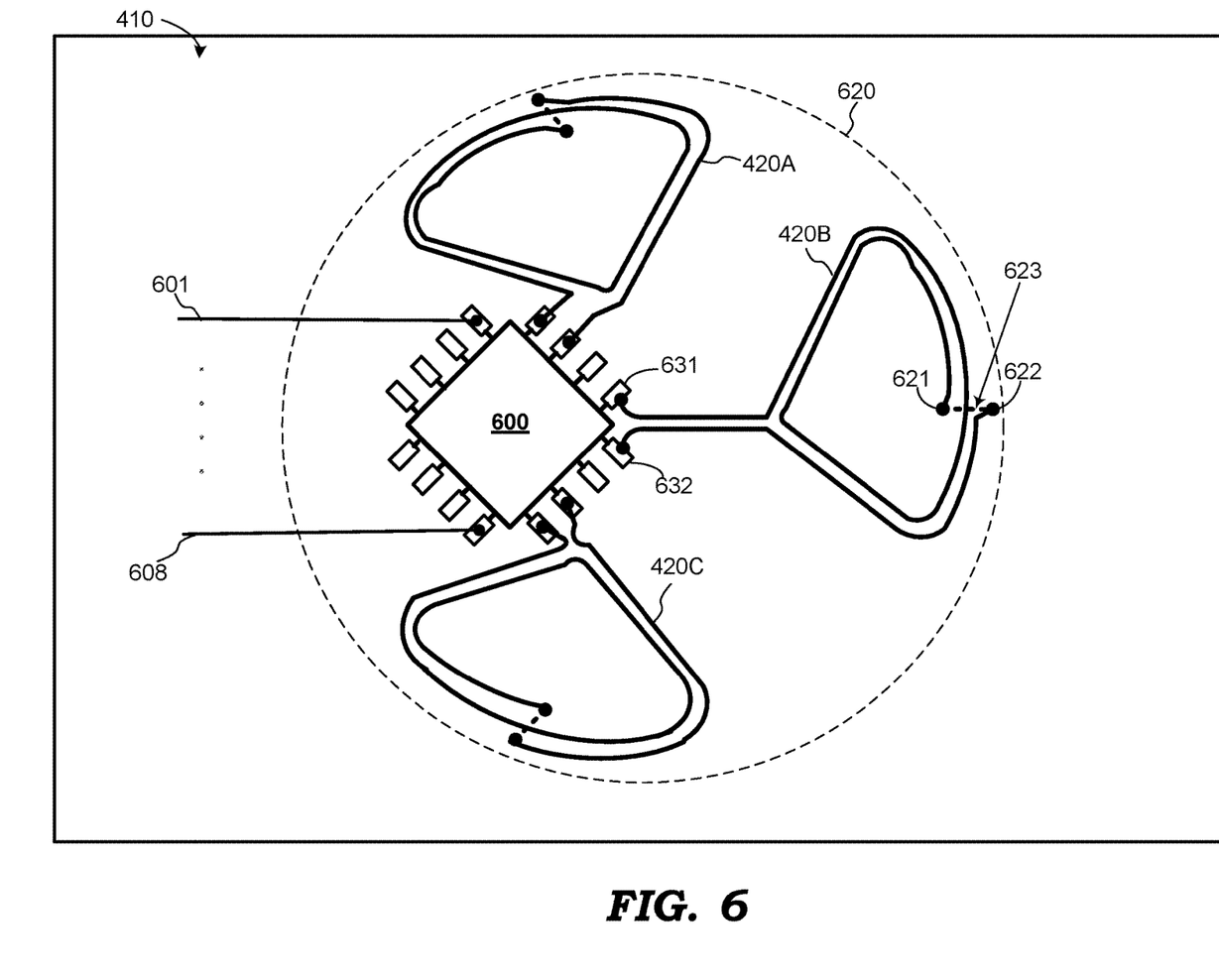
FIG. 6 is a diagram illustrating a printed circuit board (PCB) containing a sensor in integrated circuit form used for determination of fluid-flow rate and direction, and also illustrates the layout of inductor coils used by the sensor, in an embodiment of the present disclosure.

The inductors 420A, 420B and 420C may be implemented in the form of coils, and in an embodiment are circularly spaced apart at 120 degree intervals (with respect to center of circle 620) to maximize the sensitivity and coverage of the measurements by device 400. FIG. 6 is a diagram illustrating such layout of the inductors, and additionally shows PCB 410 and sensor IC (integrated circuit) 600. In FIG. 6, inductor coils 420A, 420B and 420C may be implemented in the form of conductive tracks printed on PCB 410. A small portion of each of the conductive tracks is printed on the opposite side of PCB 410 to enable the layout of each coil as shown in FIG. 6. Thus, for example, with respect to inductor 420B, vias 621 and 633 connect the small portion 623 (indicated by a dotted line) of the track printed on the opposite side of PCB 410. Inductors 420A and 420C are implemented similarly. In alternative embodiments, other angles and/or layouts of the inductors may be employed. Further, while each inductor coil is shown as having two-turns, they may, in general, have more or fewer turns. Rectangular bars such as 631 and 632 represent signal pads used for connection to pins of sensor 600. Each of inductors 420A, 420B and 420C is shown connected between two corresponding pins of sensor 600.

In the example of FIG. 6, sensor IC 600 incorporates all the circuit blocks/components of FIG. 4B except logic block 470, which is implemented external to sensor IC 600 and to PCB 410, for example, in the form of a microcontroller. However, it is noted that fewer or all of the blocks of FIG. 4B can be implemented separate from PCB 410. In FIG. 6, the outputs of sensor IC 620 correspond to the signals on paths 467 and 447 of FIG. 4B, and are shown to be provided respectively on paths 601 and 608. Sensor IC 600 may also provide other signals, not shown in FIG. 6, but which may include, for example, internal nodes/paths of the blocks of FIG. 4B, excluding those of logic block 470. All such node/paths (including paths 601 and 608) may be terminated on a connector (also not shown) on PCB 410. The external microcontroller interfaces with sensor IC 600 via such connector.

In the interest of conciseness, it is assumed in the following description that the arrangement of plate/disc 260 along with shaft 240 and the corresponding coupling mechanisms to the fluid (whose direction is to be measured) as noted in FIG. 3A is used in conjunction with device 400, and the details/illustrations are not repeated here. PCB 410 or device 400, in general, is placed in proximity to disc 260 in a manner similar to that as noted above with respect to PCB 110 of FIG. 1. Also, it is assumed that default values of inductances L40, L41 and L42 are all equal the default resonant frequencies In an embodiment, disc 260 is placed proximal to PCB 410, with the planes of PCB 410 and disc 260 being substantially parallel to each other, and the center of circle 620 (FIG. 6) encompassing the three inductors aligns with (is on the same line as) shaft 240.

The example topology of FIG. 2 described above may be used to implement each of the oscillators 405A, 405B and 405C. The sinusoidal signals F40, F41 and F42 may be converted to digital square wave signals by front-end components (e.g., comparators) contained within counters 440 and 460, and divider 450. It is also noted here that oscillators 405A, 405B and 405C may be implemented in other forms and using other topologies as well, as is well known in the relevant arts.

Counter 460 counts the number of cycles of signal 409A. Counter 460 may be implemented, for example, using a chain of flip-flops connected in sequence, and receives a signal 454 from divider 450. Signal 454 may, for example, be connected to an "enable" terminal of counter 460 that enables the counting operation of counter 460. Signal 454 indicates start and end instants defining a 'count window' of counter 460. Counter 460 may be implemented in a known way. Thus, counter 460 can be used to obtain the number of oscillations (cycles) of oscillator 405A by counting the number of rising or falling edges of signal 409A occurring in a fixed duration (count window).

Counter 440 operates similar to counter 460 described above (except that counter 440 receives signal 409B rather than 409A), and the description is not repeated in the interest of conciseness. Counters 440 and 460 forward their respective count values determined to logic block 470 via respective paths 447 and 467.

Divider 450 is a digital block that divides the frequency of signal F40 by a fixed value (although the value itself is programmable or can be changed easily) to generate a frequency-divided signal on path 454. As an example, the logic-high duration (or the logic-low duration, or one cycle/period) of the frequency-divided signal can be used to enable each of counters 440 and 460 to count, thus defining the count-window. Alternatively, rather than forwarding the frequency-divided signal itself on path 454, signals derived from the frequency-divided signal can instead be forwarded on path 454 to set the count window.

Similar to as noted above with respect to FIG. 1A, the count obtained by counters 440 and 460 are respectively dependent on the frequencies of signal pairs 409A/409C and 409B/409C. The frequencies of signals 409A, 409B and 409C are respectively inversely proportional to inductances L42, L41 and L40. The degree of change in inductance depends on how close the metal is to the corresponding inductor(s).

Logic block 470 receives the respective count values of counters 460 and 440 occurring in the count window on respective paths 467 and 447, and processes the count values to determine direction of fluid-flow and rate of flow as described below.

Similar to as in FIG. 1, oscillator 405C may be viewed as a 'reference' oscillator, and inductor L40 a 'reference' inductor. Due to the use of a reference inductor, measurement of direction of fluid-low may be rendered immune to changes in environmental conditions such as for example, temperature and humidity.

The manner in which device 400 determines direction of fluid-flow is described next with references to FIGS. 4 and 5. In each of FIGS. 5A, 5B and 5C, only PCB 410 and inductors L42, L41 and L40 are shown, although it is to be understood that the other components/blocks of device 400 would also be present. The locations of inductors L40, L41 and L42 are indicated respectively by circles with internal labels 40, 41 and 42. In each of FIGS. 5A, 5B and 5C, a hashed circle (e.g., circles with labels 40 and 41 in FIG. 5A) indicates that the metal portion 220 of disc 260 is proximal to the corresponding inductors as the disc rotates due to fluid flow, while a non-hashed circle (e.g., circle with label 42 in FIG. 5A) indicates that the non-metal portion of disc 260 is proximal to the corresponding inductor(s) as the disc rotates due to fluid flow.

Figure 5A:
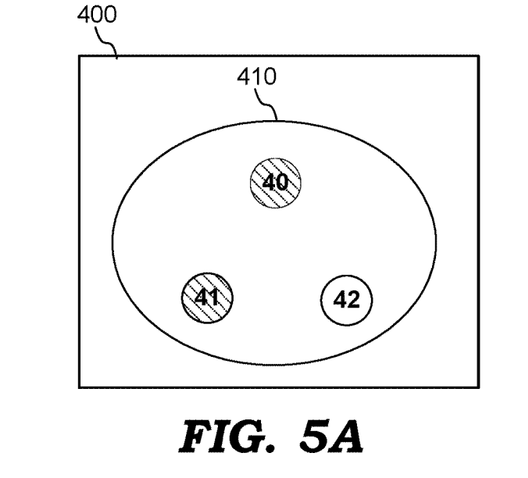
FIGS. 5A, 5B and 5C are diagrams used to illustrate the manner of determination of direction of fluid-flow as well as rate of fluid-flow, in in an embodiment of the present disclosure.
Figure 5B:
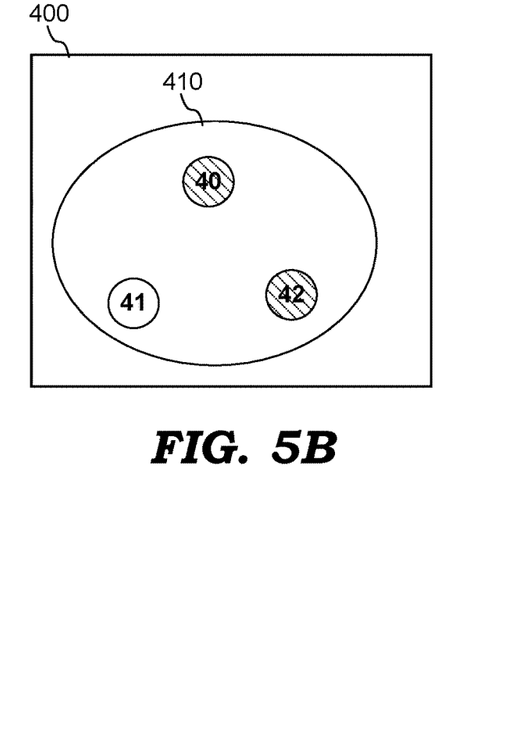
Figure 5C:
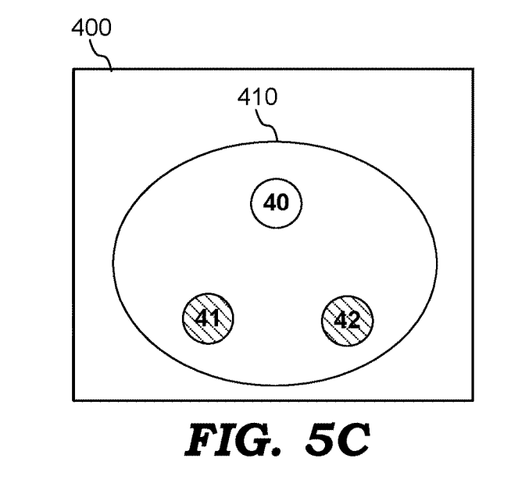

As disc 260 rotates, the conditions indicated in FIGS. 5A, 5B and 5C occur. FIG. 5A represents a condition when inductors L40 and L41 are proximal to metal 220 of disc 260, and inductor L42 is proximal to non-metal 230 of disc 260. As a result, the inductance values of L41 and L40 reduce from their default values, while the inductance of L42 remains unchanged at its default value.

Based on the description provided above, the values of the respective frequencies F42, F41 and F40 change (increase) from their default values when the corresponding inductors L42, L41 and L40 is/are proximal to metal 220 as disc 260 rotates.

In the situation of FIG. 5A, L41 decreases from its default value, L42 remains at its default value, and L40 decreases from its default value. Correspondingly, F40 and F41 increase above their default values, while F42 remains at its default value. Therefore, the output of counter 460 ([(N× F42)/F40] reduces to below its default value, and the output of counter 440 ([(N×F41)/F40] remains unchanged at its default value. Therefore, the computation count difference (CD2)=["Measured Count"−Default Count"] made by logic block 470 for counter 460 will be negative, and the computation count difference (CD1)=["Measured Count"−Default Count"] made by logic block 470 for counter 440 will be zero.

Following the logic noted above, for the situation of FIG. 5B, the computation count difference (CD2)=["Measured Count"−Default Count"] made by logic block 470 for counter 460 will be zero, and the computation count difference (CD1)=["Measured Count"−Default Count"] made by logic block 470 for counter 440 will be negative.

Similarly, for the situation of FIG. 5C, the computation count difference (CD2)=["Measured Count"−Default Count"] made by logic block 470 for counter 460 will be positive, and the computation count difference (CD1)= ["Measured Count"−Default Count"] made by logic block 470 for counter 440 will also be positive.

With combined reference to FIGS. 5A, 5B and 5C, a sequence progression of disc 260 that goes through the sequence of FIG. 5A, followed by that of FIG. 5B followed by that of FIG. 5C followed by that of FIG. 5A, then repeating the same sequence, indicates that disc 260 is rotating in the clockwise direction. A sequence progression of disc 260 that goes through the sequence of FIG. 5A, followed by that of FIG. 5C followed by that of FIG. 5B followed by that of FIG. 5A, then repeating the same sequence, indicates that disc 260 is rotating in the anti-clockwise direction.

The count difference values CD1 and CD2 computed by logic block 470 are summarized as follows:
For FIG. 5A: CD1 is zero,
CD2 is negative.
For FIG. 5B: CD1 is negative,
CD2 is zero.
For FIG. 5C: CD1 is positive,
CD2 is positive.
From the above, Logic block 470 determines the direction of rotation of disc 260 as follows:

a) If the sequence of CD1 is zero, then negative, then positive AND the sequence of CD2 is negative, then zero, then positive, THEN the direction of rotation of disc 260 is clockwise.
b) If the sequence of CD1 is zero, then positive, then negative AND the sequence of CD2 is negative, then positive, then zero, THEN the direction of rotation of disc 260 is counter-clockwise.

Based on the determination of whether the rotation of disc 260 is clockwise or counter-clockwise, logic block 470 forwards on path 471 the direction of fluid flow (e.g., left or right, north or south, etc.).

It may be noted that the rate of fluid-flow can be determined by logic block 470 based on the time taken for either CD1 or CD2 to complete one cycle, as would be obvious to one skilled in the relevant arts.

It may also be noted that due to the techniques described above (including the use of a reference oscillator), oscillator-frequency can be measured (e.g., by counters) with high accuracy, thereby enabling detection of small inductance changes. This may permit a larger distance between disc 260 and the inductor coils than otherwise possible.

5. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1A, 1B, 2, 4A and 4B and 6, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:
1. A device comprising:
a first oscillator comprising a first inductor-capacitor (LC) tank circuit and a first amplifier, said first LC tank circuit and said first amplifier to together operate to generate first sustained non-decaying oscillations at a first resonant frequency determined by said first LC tank circuit, wherein a first inductor of said first LC tank circuit has a first default inductance;
a second oscillator comprising a second LC tank circuit and a second amplifier, said second LC tank circuit and said second amplifier to together operate to generate second sustained non-decaying oscillations at a second resonant frequency determined by said second LC tank circuit, wherein a second inductor of said second LC tank circuit has a second default inductance; and
a frequency comparison block, provided external to each of said first oscillator and said second oscillator, and coupled to receive each of said first sustained oscillations and said second sustained oscillations, wherein, when a metal is in proximity to one of said first inductor and said second inductor, the corresponding one of said first default inductance and said second default inductance changes, thereby changing the frequency of the corresponding one of said first sustained oscillations and said second sustained oscillations from said first resonant frequency and second resonant frequency respectively, wherein said frequency comparison block is designed to perform a comparison of the frequencies of said second sustained oscillations and said first sustained oscillations to determine a change in a corresponding one of said first default inductance and said second default inductance as a basis to conclude that said metal is in proximity to one of said first inductor and said second inductor.

2. The device of claim 1, wherein said frequency comparison block is designed to perform said comparison by obtaining a ratio of said frequencies of said second sustained oscillations and said first sustained oscillations.

3. The device of claim 2, wherein said first default inductance is equal to said second default inductance, wherein said first resonant frequency is equal to said second resonant frequency, wherein said comparison enables said frequency comparison block to determine a change in inductance of any of said first inductor and said second inductor caused by factors other than environmental conditions in which said device operates.

4. The device of claim 3, wherein said environmental conditions include ambient temperature and ambient humidity.

5. The device of claim 2, wherein each of said first oscillator and said second oscillator further comprises a corresponding amplifier configured in positive feedback mode to generate as an output said first sustained oscillations and said second sustained oscillations respectively.

6. The device of claim 1, further comprising a third oscillator comprising a third LC tank circuit, said third oscillator to generate third sustained oscillations at a third resonant frequency, wherein a third inductor of said third LC tank circuit has a third default inductance, wherein said frequency comparison block is coupled to receive said third sustained oscillations, wherein, when said metal is in proximity to said third inductor said third default inductance changes, thereby changing the frequency of said third sustained oscillations from said third resonant frequency, wherein said frequency comparison block is designed to perform another comparison of the frequencies of said third sustained oscillations and said first sustained oscillations by obtaining a ratio of said frequencies of said third sustained oscillations and said first sustained oscillations to determine a change in said third default inductance.

7. The device of claim 6, wherein said frequency comparison block comprises:

a first frequency counter coupled to receive said second sustained oscillations, and to obtain a first measured count of a number of cycles of said second sustained oscillations occurring in a count window, wherein said first measured count equals a first default count when inductances of said first inductor and said second inductor respectively equal said first default inductance and said second default inductance, but deviates from said first default count when the inductance of the corresponding one of said first inductor and said second inductor changes respectively from said first default inductance and said second default inductance;

a frequency divider coupled to receive said first sustained oscillations, and to divide the frequency of said first sustained oscillations to generate said count window, said frequency divider being coupled to said first frequency counter to indicate said count window to said first frequency counter; and a logic block coupled to receive said first measured count, said logic block to obtain a first count difference between said first measured count and said first default count, and to determine said change in the corresponding one of said first default inductance and said second default inductance based on said first count difference.

8. The device of claim 7, wherein said frequency comparison block further comprises a second frequency counter coupled to receive said third sustained oscillations and said count window, said frequency comparison block to obtain a second measured count of a number of cycles of said third sustained oscillations occurring in said count window, wherein said second measured count equals a second default count when inductances of said first inductor and said third inductor respectively equal said first default inductance and said third default inductance, but deviates from said second default count when the inductance of the corresponding one of said first inductor and said third inductor changes respectively from said first default inductance and said third default inductance, wherein said logic block is coupled to receive said second measured count, said logic block to obtain a second count difference between said second measured count and said second default count, and to determine said change in said third default inductance based on said second count difference.

9. The device of claim 8, wherein said metal comprises a portion of a rotatable surface coupled via a coupling mechanism to a fluid, the coupling mechanism being designed to cause said rotatable surface to rotate at a rate proportional to a rate of flow of said fluid and in a sense reflecting a direction of flow of said fluid, wherein rotations of said rotatable surface are designed to cause said first frequency counter to generate a first set of multiple values of said first measured count in a first set of corresponding count windows, as well as to cause said second frequency counter to generate a second set of multiple values of said second measured count in a second set of corresponding count windows, wherein said logic block is designed to determine said direction of flow of said fluid based on a processing of said first set of multiple values, said second set of multiple values, said first default count and said second default count.

10. The device of claim 9, wherein said rotatable surface is a circular disc with said metal in one hemisphere and a non-metal in the other hemisphere, wherein rotations of said rotatable surface are designed to cause said metal to be proximal to said first inductor and said second inductor in a first fraction of every full rotation of said rotatable surface, said metal to be proximal to said second inductor and said third inductor in a second fraction of said every full rotation of said rotatable surface, said metal to be proximal to said third inductor and said first inductor in a third fraction of said every full rotation of said rotatable surface, wherein said first fraction, said second fraction and said third fraction occur in sequence in said every full rotation, wherein a first sequence of said sequence comprises said first fraction, followed by said second fraction, followed by said third fraction, wherein a second sequence of said sequence comprises said first fraction, followed by said third fraction, followed by said second fraction,     wherein in said first fraction, said metal causes reduction of said first default inductance and said second default inductance, thereby causing said first measured count and said second measured count to respectively equal zero and a positive value in said first fraction, said third default inductance remaining unchanged in said first fraction,     wherein in said second fraction, said metal causes reduction of said second default inductance and said third default inductance, thereby causing said first measured count and said second measured count to respectively equal a negative value and zero in said second fraction, said first default inductance remaining unchanged in said second fraction,     wherein in said third fraction, said metal causes reduction of said first default inductance and said third default inductance, thereby causing said first measured count and said second measured count to each be a positive value in said third fraction, said second default inductance remaining unchanged in said third fraction,     wherein said logic block is designed to determine, for each of said first fraction, said second fraction and said third fraction, a first count difference (CD1) between said first measured count and said default count, and a second count difference (CD2) between said second measured count and said default count,     wherein said logic block is designed to determine said direction of flow to be in a first direction if said first count difference (CD1) successively equals zero, a negative value and a positive value and said second count difference (CD2) successively equals a negative value, zero and a positive value, and     wherein said logic block is designed to determine said direction of flow to be in a second direction opposite to said first direction if said first count difference (CD1) successively equals zero, a positive value and a negative value and said second count difference (CD2) successively equals a negative value, a positive value and zero.

11. The device of claim 10, further comprising a printed circuit board (PCB), wherein said first oscillator, said second oscillator, said third oscillator, said first counter, said second counter, said frequency divider, and said logic block are mounted on said PCB,     wherein each of said first inductor, said second inductor and said third inductor is implemented in the form of conductive tracks on said PCB, and spaced apart at 120 degree-intervals of a circle on said PCB.

12. The device of claim 11, wherein a plane of said circular disc is arranged to be parallel to a plane of said PCB, a center of said circular disc being aligned with a center of said circle.

13. The device of claim 7, wherein said metal comprises a portion of a rotatable surface coupled via a coupling mechanism to a fluid, the coupling mechanism being designed to cause said rotatable surface to rotate at a rate proportional to a rate of flow of said fluid thereby causing said first frequency counter to generate a set of multiple values of said first measured count in corresponding count windows,     wherein said logic block is designed to determine said rate of flow of said fluid based on a processing of said set of multiple values and said first default count.

14. The device of claim 13, wherein said rotatable surface is a circular disc with said metal in one hemisphere and a non-metal in the other hemisphere, wherein rotations of said rotatable surface are designed to cause said metal to be proximal alternately to said first inductor and said second inductor in corresponding fractions of every full rotation of said rotatable surface, thereby reducing said first default inductance and increasing said first measured count to be greater than said default count, as well as reducing said second default inductance and reducing said first measured count to be less than said default count, in said corresponding fractions of every full rotation, wherein inductances of each of said first inductor and said second inductor remain unchanged at their respective default values when said non-metal is proximal to either of said first inductor and said second inductor,     wherein said logic block is designed to determine a count difference value between values in said set of multiple values and said first default count, said count difference having a positive value in one fraction of said corresponding fractions of said every full rotation, said count difference having a negative value in the other fraction of said corresponding fractions of said every full rotation,     wherein said logic block is designed to determine said rate of flow of said fluid based on one or more transitions between said negative value and said positive value or vice versa.

15. The device of claim 1, wherein said metal comprises a portion of a surface in one of a rectilinear motion and a rotational motion proximal to said device, wherein motion of said surface sequentially causes a change in each one of said first default inductance and said second default inductance,     wherein said frequency comparison block is designed to determine a speed of the corresponding one of said rectilinear motion and said rotational motion by computing a time difference between occurrences of said change in each one of said first default inductance and said second default inductance.

16. The device of claim 1, wherein said frequency comparison block is designed to perform said comparison by obtaining a difference between the frequencies of said first sustained oscillations and said second sustained oscillations,     wherein when said difference is positive, said frequency comparison block concludes that said metal is in proximity to said first inductor,     wherein when said difference is negative, said frequency comparison block concludes that said metal is in proximity to said second inductor.

17. The device of claim 1, wherein said frequency comparison block generates a number with a sign and magnitude as representing a result of said comparison, wherein said sign is a negative value when said first default inductance is identified as having changed, and is a positive value when said second default inductance is identified as having changed.

18. A method implemented in a device, said method comprising:

receiving first sustained non-decaying oscillations at a first resonant frequency generated by a first combination of a first LC (inductor-capacitor) tank circuit and a first amplifier, said first combination representing a first oscillator, wherein said first resonant frequency is determined by said first LC tank circuit, wherein a first inductor of said first LC tank circuit has a first default inductance;

receiving second sustained non-decaying oscillations at a second resonant frequency generated by a second combination of a second LC (inductor-capacitor) tank circuit and a second amplifier, said second combination representing a second oscillator, wherein said second resonant frequency is determined by said second LC tank circuit, wherein a second inductor of said second LC tank circuit has a second default inductance; and comparing, using a frequency comparison block provided external to each of said first oscillator and said second oscillator, the frequencies of the first sustained oscillations and the second sustained oscillations to determine a change in a corresponding one of said first default inductance and said second default inductance, wherein each of said first oscillator, said second oscillator and said frequency comparison block is comprised in said device.

19. The method of claim 18, wherein said comparing generates a number with a sign and magnitude as representing a corresponding result, wherein said sign is a negative value when said first default inductance is identified as having changed, and is a positive value when said second default inductance is identified as having changed.

20. A device comprising:

a first oscillator comprising a first inductor-capacitor (LC) tank circuit, said first oscillator to generate first sustained oscillations at a first resonant frequency determined by said first LC tank circuit, wherein a first inductor of said first LC tank circuit has a first default inductance; and a second oscillator comprising a second LC tank circuit, said second oscillator to generate second sustained oscillations at a second resonant frequency determined by said second LC tank circuit, wherein a second inductor of said second LC tank circuit has a second default inductance; and a frequency comparison block, provided external to each of said first oscillator and said second oscillator, and coupled to receive each of said first sustained oscillations and said second sustained oscillations, wherein, when a metal is in proximity to one of said first inductor and said second inductor, the corresponding one of said first default inductance and said second default inductance changes, thereby changing the frequency of the corresponding one of said first sustained oscillations and said second sustained oscillations from said first resonant frequency and second resonant frequency respectively, wherein said frequency comparison block is designed to perform a comparison of the frequencies of said second sustained oscillations and said first sustained oscillations to determine a change in a corresponding one of said first default inductance and said second default inductance as a basis to conclude that said metal is in proximity to one of said first inductor and said second inductor, wherein said first default inductance is equal to said second default inductance, wherein said first resonant frequency is equal to said second resonant frequency, wherein said comparison enables said frequency comparison block to determine a change in inductance of any of said first inductor and said second inductor caused by factors other than environmental conditions in which said device operates.

* * * * *